United States Patent [19]

Vetter et al.

[11] Patent Number: 4,997,490
[45] Date of Patent: Mar. 5, 1991

[54] METHOD OF CLEANING AND RINSING WAFERS

[75] Inventors: William L. Vetter, American Fork; Dennis L. Mortensen, Sandy, both of Utah

[73] Assignee: Bold Plastics, Inc., West Jordan, Utah

[21] Appl. No.: 561,805

[22] Filed: Aug. 2, 1990

[51] Int. Cl.$^5$ .............................. B08B 3/04; B08B 3/08
[52] U.S. Cl. .................................... 134/26; 134/34; 134/95
[58] Field of Search ............................ 134/26, 34, 95

[56] References Cited

U.S. PATENT DOCUMENTS 4,375,992  3/1983  Stevens et al. ..................... 134/34
4,917,123  4/1990  McConnell et al. ................. 134/95

Primary Examiner—Asok Pal
Assistant Examiner—Saeed Chaudhry
Attorney, Agent, or Firm—Terry M. Crelling

[57] ABSTRACT

A method for cleaning and rinsing wafers used in the production of integrated circuits is disclosed. The wafers are submerged in a tank containing deionized water and the method includes repeated cycles comprising the steps of (1) introducing deionized water into the filled tank for a preset period of time to create an upward flow of water in the tank and about the wafers, with the outflow of water flowing over the top edges of the tank, (2) partially draining the tank to a level just above the upper edges of the wafers, and (3) refilling the tank with fresh deionized water. The number of cycles can be repeated a preset number of times or the quality of the water in the tank can be monitored, with the cycles being repeated until a preset quality of water is achieved in the tank.

15 Claims, No Drawings

METHOD OF CLEANING AND RINSING WAFERS

BACKGROUND OF THE INVENTION

1. Field of the Invention

The present invention relates to methods of cleaning and rinsing silicon wafers or other wafers or thin disc-like substrates or element in the semiconductor process industry. The term "wafers" as used throughout this disclosure is meant to include any thin disc-like substrates in the semiconductor process industry, including substrates made of silicon, gallium arsenide, glass as well as masks made of polyamide material.

2. State of the Art

In the processing of wafers to make semiconductor devices, the wafers are subjected to numerous processing steps. Generally, the wafers must be cleaned and rinsed between each processing operation, and depending upon the particular process, the wafers may be put through a cleaner-rinser anywhere from 20 to 30 times. The condition of the wafers prior to each cleaning and rinsing depends upon the immediately preceding operation that the wafers have been through.

Cleaning and rinsing commonly serve two basic purposes. The first is to stop the etching process or other chemical process to which the wafers have been subjected. The second is to remove the etchant chemical or other chemical from the surface of the wafer. This has been accomplished by one of three commonly used methods: cascade overflow, tank dumping and spray spinning.

In the cascade overflow method, a tank is filled with deionized water until it overflows. The wafers are submerged in the upwardly flowing water in the tank. The upward flow of water carries chemicals and contaminants away from the wafers. Nitrogen is commonly bubbled into the upward flow of water to assist in cleaning and rinsing the wafers as well as reducing residual oxidation of the wafer surfaces.

Dump cleaning and rinsing has grown rapidly in popularity, and is a very effective method for accomplishing both of the aforementioned purposes of the clean and rinse operation. Using the dump method, the wafers are placed in a full cascading bath. Deionized water and nitrogen is admitted briefly as in the cascade method. The water is then rapidly dumped out the bottom of the tank through a trap door. The cycle is repeated several times.

In spin cleaning and rinsing, the apparatus operates on the principle of a centrifuge. Deionized water is sprayed on the wafers as they are spinning in the apparatus. Because of the spinning action, the wafers are subjected to high stress. In addition, wafer dust is generated and redeposited on the wafer surfaces along with other particulate accumulations.

There has been no suggestion of a method for cleaning and rinsing wafers wherein repeated cycles of sequences involving a cascade overflow step followed by a partial dump of the water from the tank. In the partial dump, the water level is not lowered below the top edges of the wafers in the tank, and the wafers are not therefor repeatedly subjected to air during the cleaning and rinsing operation. This greatly reduces inherent growth of oxide on the wafers as well as the migration of contaminants from the air to the wafers.

The parameters of the operation through which the wafers have passed immediately before cleaning and rinsing also effect the optimum parameters for the cleaning and rinsing operation. In particular, the amount of deionized water, the pH and other chemical content of the water as well as the temperature of the water are all dependent upon the conditions of the wafers as the wafers are received from previous operations. In the practices of the prior art, it has been common to disregard optimum conditions and instead use large excesses of deionized water during the cleaning and rinsing to overcome any inefficiency. It has also been common to use hot deionized water when it is really not needed. The hot deionized water can in fact be less effective than cool deionized water in many applications. However, there are certain applications when hot deionized water is useful. Deionized water, either hot or cold, is costly, and the wasteful practices of using excess water in the cleaning and rinsing operations is being discouraged, especially in arid areas where water is at a premium.

Various of the operations that the wafers undergo result in the surfaces of the wafers being hydrophobic. Some of the operations result in wafers having more hydrophilic surfaces. It has been recognized that wafers exhibiting hydrophobic surfaces are prone to interact with the cleaning and rinsing operation to yield widely varying particle counts of contaminants left on the wafers following the cleaning and rinsing. Wafers exhibiting more hydrophilic surfaces react much better to the cleaning and rinsing than the wafers having hydrophobic surfaces.

There has been no suggestion in the prior art of monitoring quality of the deionized water including contaminants contained in the water and chemical characteristics of the water in the tank and of using the quality monitoring to control the method of cleaning and rinsing. The quality of the water with respect to contaminants can be used, in accordance with the present invention, to control the cycling of steps of the method to achieve exceptional results in a minimum of time expended in the cleaning and rinsing operation. In addition, a minimum of deionized water is consumed. Monitoring of chemical characteristics of the deionized water allows the addition of chemicals to alter the chemical characteristics of the water to a more favorable condition, which again saves time and minimizes consumption of deionized water.

3. Objectives

A principal objective of the invention is to provide an improved method of cleaning and rinsing wafers that utilizes a combination of sequenced cascade overflow steps and partial dumps of the water in the tank, whereby the efficiency of the cleaning and rinsing is significantly improved so as to decrease time required in the cleaning and rinsing operation as well as to reduce the amount of deionized water used in the cleaning and rinsing. The partial dumping eliminates exposure of wafers to air and thus reduces the potential for oxide growth and particulate contamination on the wafers during the cleaning and rinsing operation.

A particular objective of the present invention is to provide a method wherein the deionized water in the cleaning and rinsing tank is monitored for a water quality characteristic indicative of contaminants in the water, with the number of cycles of sequenced cascade overflow steps and dump steps being controlled by the monitored characteristic to insure a rinse to a preset quality with a minimal amount of deionized water being consumed. The method can also be set to produce a warning indication when the preset quality has not been attained in a preset number of cycles of the sequenced cascade overflow steps and dump steps. Further, an enhanced cascade overflow mode can be activated at the same time or in place of the warning indication.

An additional objective of the present invention is to provide a sampling chamber connected to the cleaning and rinsing tank by a conduit having a valve therein, whereby the probe for monitoring of the water quality characteristic is contained in the sampling chamber and thus isolated from the cleaning and rinsing tank, and the valve is controlled to eliminate back flow of water from the sampling chamber to the cleaning and rinsing tank.

A still additional objective of the present invention is to provide a spray of fresh deionized water on the surface of the deionized water in the cleaning and rinsing tank at those times when water is overflowing the top of the tank so as to aid in removal of particulate contamination from the tank.

Another objective of the present invention is to provide a blanket of nitrogen over the top of the cleaning and rinsing tank to eliminate the necessity of a lid for the tank and to provide a nitrogen environment for the wafers during a full dump of the water from the tank as well as to eliminate particulate contaminants from migrating to the deionized water in the tank from the environment about the top of the tank.

Still another objective of the present invention is to provide for injection of nitrogen into the deionized water introduced into the cleaning and rinsing tank to aid in the cleaning and rinsing of the wafers and reduce normally inherent residual growth of oxide on the wafers in the tank.

Yet still another objective of the present invention is to provide a method wherein the deionized water in the cleaning and rinsing tank is monitored for a chemical characteristic of the water and/or the water-wafer system in the tank which is indicative of a chemical phenomena, whereby corrective chemicals can be added to the water in the tank to mitigate the chemical phenomena being monitored. For example, the pH and the oxidation reduction potential of the water in the tank can be controlled. Appropriate chemicals such as choline can be added to control the pH, and oxidizing agents such as hydrogen peroxide can be added when necessary to control the oxidation reduction potential. Control of the oxidation reduction potential mitigates the hydrophobic character of wafers and converts the wafers to a more hydrophilic character as well as to inhibit oxide growth on the wafers in the tank.

A further objective of the present invention is to provide a sampling chamber connected to the cleaning and rinsing tank by a conduit having a valve therein, whereby the probe for monitoring of the chemical characteristic of the water in the tank is contained in the sampling chamber and thus isolated from the cleaning and rinsing tank, and the valve is controlled to eliminate back flow of water from the sampling chamber to the cleaning and rinsing tank.

A still further objective of the present invention is to provide a hot deionized water manifold that allows the use of hot deionized water when certain chemicals are encountered in the cleaning and rinsing tank. The hot water acts to reduce surface tension adhesion characteristics of those chemicals as well as maintain a high solubility level for saturated buffered oxide etchants.

A yet still further objective of the present invention is to provide a method of cleaning and rinsing wafers that is always in a dynamic state, with a constant bleed of deionized water through the means for introducing the water to the cleaning and rinsing tank as well as through the sprayers at the top of the tank when such sprayers are employed. The constant bleed of deionized water inhibits bacterial growth in the apparatus of the method.

4. Related Application

This application is related to our copending application Ser. No. 07/561,778 for Apparatus for Cleaning and Rinsing Wafers which is being filed concurrently herewith and the entire contents of the copending application are incorporated herein by reference.

DETAILED DESCRIPTION OF THE INVENTION

The above objectives are achieved in accordance with the present invention by providing an improved method of cleaning and rinsing wafers in the production of integrated circuits. The new, improved method comprises transferring wafers, contained in a carrier in which the wafers are supported in spaced, parallel relation, to a tank filled with deionized water. The wafers are submerged below the surface of the deionized water so that the upper edges of the wafers are spaced below the surface of the deionized water. Generally, the tank will have the capacity to accept two cassettes full of wafers in side-by-side arrangement; however, tanks capable of handling more or less cassettes can be used when such capacity is desired. The tank should have sufficient depth that when the tank is filled to its capacity with deionized water, the cassettes and wafers are submerged beneath the surface of the deionized water by a distance at least about half the diameter of the wafers or such that up to about $\frac{1}{4}$ to $\frac{1}{3}$ of the water in the tank can be drained from the tank without exposing the upper edges of the wafers positioned in the tank.

Following placement of the wafers in the tank filled with deionized water, substantially the entire volume of water contained in the tank is dumped or quickly drained through a comparatively large valve or trap door at the bottom of the tank. This initial dumping of the water from the tank containing the wafers is effective to remove a large percentage of the process liquids and other materials contained on the wafers as they come from a previous operation in the overall process of manufacturing integrated circuits. There can be a relatively small period of time, say several seconds, pass between the placement of the wafers in the tank filled with deionized water and the dumping of the water from the tank. This small period of time allows the process liquids and other materials on the wafers to rapidly disperse into the deionized water in the tank.

In a modified embodiment of the method of the present invention, fresh deionized water can be introduced into the tank for a preset period of time, up to 990 seconds for example, prior to the dumping or rapid draining of the water bath from the tank. The fresh deionized water is introduced to the tank through a diffuser at the bottom of the tank to create a flow of deionized water upwardly through the tank and about the wafers contained therein. Deionized water at the top of the tank flows out of the tank by cascading over the top edges of the tank.

Following the dumping of the water bath from the tank, the tank is filled with fresh deionized water through the diffuser at the bottom of the tank. Once the tank has again become filled with deionized water, a series of cycles of cleaning and rinsing is followed in accordance with the present invention. Each cycle in the series of cycles consists of a three step sequence. The first step of the three step sequence of each cycle consists of introducing fresh deionized water for a preset period of time into the tank through a diffuser to create a flow of deionized water upwardly through the tank and about the wafers which are submerged in the deionized water. The deionized water flows out of the tank over the top edges of the tank. The second step of the three step sequence of each cycle consists of partially draining deionized water from the tank to a level just above the upper edges of the wafers contained therein. The third step of the three step sequence of each cycle consists of filling the tank with fresh deionized water.

The number of cycles of the three step sequence can be set at a preset number selected from past experience. It is preferable, however, to control the number of cycles to obtain a set quality of water in the tank. Each cycle will, of course, contain water having a higher quality, i.e. the lack of undesired contaminants, than the water of the previous cycle. In accordance with a preferred embodiment of the present invention, at least one characteristic indicative of the contaminants in the deionized water in the tank is monitored during each cycle, and if the characteristic attains a preset value in any cycle before the preset number of cycles have been accomplished, the remaining number of cycles are cancelled. The characteristic which is monitored can be the resistivity of the water in the tank or the conductivity of the water in the tank. Generally, it is preferred to monitor the resistivity of the water in the tank.

Although the method of the present invention can be done manually, that is an operator performs each step in the method, it is preferable to automate the process by providing an electronic controller that can be programmed to operate each step in the method. The controller would be programmed with the set number of cycles which is to be a limit, and the controller would analyze the monitored characteristic during each cycle. If the monitored characteristic attained its preset condition, the controller would terminate the cleaning and rinsing operation at that cycle. If the monitored characteristic has not attained its preset condition, the controller directs the operation of the next cycle.

By monitoring the quality of the water in each cycle and ending the cleaning and rinsing operation when the selected quality of water is achieved, it has been found that wafers having superior quality are produced in a much shorter time and with much less deionized water being used than with prior art processes. The number of cycles to achieve the set quality of the water is significantly less than would be selected by experience alone. Usually, when experience alone is used as a guide, a large excess of cleaning and rinsing time will be employed, as is done in the processes of the prior art, to insure adequate cleaning and rinsing. It has unexpectedly been found that by monitoring the water quality and ending the cleaning and rinsing operation when a selected quality of water is achieved, the amount of water used will be up to $\frac{1}{3}$ less than the amount of water used in prior art methods, and the high quality of the wafers will be much more consistent In addition, a significant decrease in the time for cleaning and rinsing the wafers is achieved. This improved efficiency allows for greater utilization of the cleaning and rinsing apparatus.

Occasionally, the desired quality characteristic of the water will not be achieved in the preset number of cycles which has been set as a limit. In a preferred embodiment of the invention, if the characteristic of the water in the tank has not attained the preset value by the end of the preset number of cycles selected as the upper limit, then the following additional steps are performed at the end of the preset number of cycles. The characteristic of the deionized water in the tank is continued to be monitored. Fresh deionized water is introduced into the tank through a diffuser to create a flow of deionized water upwardly through the tank and about the wafers which are submerged in the deionized water, with deionized water flowing out of the tank over the top edges of the tank. The introduction of fresh deionized water is continued for a preset period of time or until the monitored characteristic of the deionized water in the tank attains its preset value.

When an automatic controller is being used to operate the cleaning and rinsing operation, it is advantageous for the controller to give some visual or audible indication that the additional procedure has been required. This will alert the operator so that the operator can then analyze the situation in an attempt to determine why the additional procedure was required. If an equipment malfunction is the cause then such malfunction can quickly be corrected.

Monitoring of the quality of the deionized water in the cleaning and rinse tank must be done so as to avoid contaminants being introduced into the water by the monitoring apparatus. In accordance with the present invention, the monitoring of the quality characteristic is done by withdrawing deionized water from the tank through a conduit into a chamber external of the tank, with the monitoring being done in the deionized water in the chamber. A valve is provided in the conduit and the valve can be opened during steps in which deionized water is being added to the tank or in which water is present in the tank at a level of at least that of the upper edges of the wafers contained in the tank. Advantageously, the valve in the monitoring circuit is opened and closed simultaneously with the opening and closing of the valve used in controlling the introduction of deionized water to the tank.

It is also advantageous to monitor, at least one other characteristic related to chemical phenomena of the deionized water in the tank. Such other characteristics include the pH of the deionized water and the reduction-oxidation potential of the deionized water. Chemicals are added to the deionized water in the tank in response to the monitoring of the other characteristic. It is advantageous to provide a monitor for the reduction-oxidation potential of the water in the tank inasmuch as that variable will indicate if the wafers are of the type which exhibit hydrophobic character. The monitoring must be done before the initial dump of the water from the tank. If the monitoring detects such a condition, the program is delayed to allow time for a corrective chemical to be added to the water to change the character of the wafers to be more hydrophilic than hydrophobic. Hydrogen peroxide or other well know oxidizing agents can be added to the water prior to the initial dump to convert the wafers to the more hydrophilic characteristic The monitoring of the chemical characteristic of the water in the tank is done by withdrawing deionized water from the tank through a conduit into a chamber external of the tank. The monitoring is done in the deionized water in the chamber. Preferably, a valve is provided in the conduit and the valve can be opened during steps in which deionized water is being added to the tank or in which water is present in the tank at a level of at least that of the upper edges of the wafers contained in the tank. Advantageously, the valve in the monitoring circuit is opened and closed simultaneously with the opening and closing of the valve used in controlling the introduction of deionized water to the tank.

It is also advantageous to spray fresh deionized water on the surface of the body of deionized water in the tank during step cascade overflow of outflow water from the tank. The spray of water tends to drive contaminants, especially particulates, on the top of the body of water in the tank toward the edges of the tank to flow with the cascading overflow out of the tank. The spray is preferably a full cone adjustable spray, and the spray must be of the low pressure, non-misting type Spray particles must be at least about 1000 microns or greater in size. Smaller spray particles present abnormal surface area to the air above the tank. The small, mist-type particles readily absorb contaminants such as carbon dioxide from the air and carry the contaminants into the water contained in the tank. Larger spray particles have much less surface area and absorb much less contaminants from the air. The larger particles thus cause far less degradation in the water in the tank, and it has been found that any degradation caused by the contaminants in the spray is far offset by the beneficial effect of the spray in moving particulates on the surface of the body of water in the tank to the edges of the tank where they are flushed out with the cascading outflow of the tank. By arranging a bank of spray nozzles on opposite ends of the tank, and directing the spray toward the center of the tank, a sweeping action is achieved which pushes particulate matter at the top of the tank to the center and then the sides of the tank to be washed out of the tank with the cascading outflow of water from the tank.

In a further embodiment of the method in accordance with the present invention, a nitrogen blanket can be provided over the top of the tank. The nitrogen blanket can eliminate the necessity of a lid for the tank. A lid can be a disadvantage because of water drops forming and accumulating on the lid, with the water drops ultimately falling back into the tank. The nitrogen blanket also provides a nitrogen environment for the wafers during the full dump of the water from the tank, also a lid presents problems with bacterial growth. The nitrogen blanket also tends to isolate the water sprays at the top of the tank from air. Nitrogen absorbtion into the water being sprayed on the tank is not deleterious in any manner, whereas absorbtion of air and contaminants such as carbon dioxide in the air is to be avoided.

The filtered nitrogen forming the blanket over the top of the tank also eliminates particulate contaminants from migrating to the deionized water in the tank from the air environment about the top of the tank. Nitrogen can also be injected into the deionized water introduced into the tank. Water saturated with nitrogen is effective in cleaning and rinsing the wafer and further has the effect of reducing normally inherent residual growth of oxide on the wafers in the tank.

In a modified embodiment of the method of the present invention, a monitoring means is provided for detecting the quality characteristic indicative of contaminants in the fresh deionized water being supplied to the cleaning and rinsing tank. Determining the quality of the supply of deionized water is very beneficial. If the controller is set to achieve an end point quality of the water in the cleaning and rinsing tank that is higher in quality than the fresh deionized water being supplied to the tank, the method will not, of course, be able to achieve the set end quality no matter how many cycles of the method are performed. Top guard against such occurrences, the controller compares the quality of the incoming, fresh deionized water with the set end point quality of the water in the cleaning and rinsing tank. If the end set point is higher in quality than the incoming fresh deionized water, the controller stops the process and gives an alarm.

In another modification of the method of the present invention, hot deionized water can be supplied to the cleaning and rinsing tank when certain chemicals are encountered in the cleaning and rinsing tank. The hot deionized water acts to reduce surface tension adhesion characteristics of those chemicals and to maintain a high solubility level for those chemicals.

It is advantageous to provide a constant bleed of deionized water through all the means associated with the method that handle or convey deionized water. This includes the supply tube, the tube feeding the spray nozzles, the spray nozzles themselves, the tube or tubes supplying the monitoring chambers, the monitoring chambers themselves and the tank proper. The bleed of deionized water through the water handling means prevents bacterial growth therein In practice, all valves controlling flow of deionized water in any of the tubes, chambers, nozzles and the tank are of the type that allow a small bleed of deionized water past the valves when the valves are closed.

Although preferred embodiments of the improved method of the present invention have been described, it is to be understood that the present disclosure is made by way of example and that various other embodiments are possible without departing from the subject matter coming within the scope of the following claims, which subject matter is regarded as the invention.

We claim

1. A method of cleaning and rinsing wafers used in the production of integrated circuits, said method comprising
    (a) transferring wafers, contained in a carrier in which the wafers are supported in spaced, parallel relation, to a tank filled with deionized water, said tank having a top edge and a bottom, and submerging the wafers below the surface of the deionized water so that the upper edges of the wafers are spaced below the surface of the deionized water;
    (b) dump draining the deionized water through the bottom of the tank;
    (c) filling the tank with fresh deionized water;
    (d) introducing fresh deionized water for a preset period of time into said tank through a diffuser to create a flow of deionized water upwardly through the tank and about said wafers which are submerged in the deionized water, with deionized water flowing out of the tank over the top edges of the tank;
    (e) partially draining deionized water from said tank to a level just above the upper edges of said wafers;
    (f) filling the tank with fresh deionized water;
    (g) introducing fresh deionized water for a preset period of time into said tank through a diffuser to create a flow of deionized water upwardly through the tank and about said wafers which are submerged in the deionized water, with deionized water flowing out of the tank over the top edges of the tank; and (h) repeating steps (e) through (g) a preset number of times.

2. A method of cleaning and rinsing wafers in accordance with claim 1, wherein the following step is performed between step (a) and step (b)

introducing fresh deionized water for a preset period of time into said tank through a diffuser to create a flow of deionized water upwardly through the tank and about said wafers which are submerged in the deionized water, with deionized water flowing out of the tank over the top edges of the tank 3. A method of cleaning and rinsing wafers in accordance with claim 1, wherein at least one characteristic indicative of contaminants in the deionized water in said tank is monitored during steps (c) through (h), and if the characteristic attains a preset value in step (h) before the preset number of repeats of steps (e) through (g) have been accomplished, the remaining number of repeats are cancelled.

4. A method of cleaning and rinsing wafers in accordance with claim 1, wherein the characteristic monitored is resistivity of the water in the tank.

5. A method of cleaning and rinsing wafers in accordance with claim 1, wherein the characteristic monitored is conductivity of the water in the tank.

6. A method of cleaning and rinsing wafers in accordance with claim 3, wherein if the characteristic of the deionized water in the tank as not attained a preset value by the end of the preset number of repeats in step (h), then the following additional steps are performed (i) the characteristic of the deionized water in the tank is continued to be monitored; and (j) fresh deionized water is introduced into said tank through a diffuser to create a flow of deionized water upwardly through the tank and about said wafers which are submerged in the deionized water, with deionized water flowing out of the tank over the top edges of the tank; and (k) continuing the introduction of fresh deionized water in step (j) for a preset period of time or until the monitored characteristic of the deionized water in said tank attains its preset value.

7. A method of cleaning and rinsing wafers in accordance with claim 3, wherein the supply of fresh deionized water is monitored for the same characteristic as that being monitored in said tank, and if the monitored characteristic of the supply is of less quality than the preset value to be achieved in step (h), the method is interrupted and an alarm is given.

8. A method of cleaning and rinsing wafers in accordance with claim 3, wherein the monitoring of said one characteristic is done by withdrawing deionized water from the tank through a conduit into a chamber external of the tank, with the monitoring being done in the deionized water in said chamber.

9. A method of cleaning and rinsing wafers in accordance with claim 8, wherein a valve is provided in said conduit and the valve is opened only during steps (d) through (h).

10. A method of cleaning and rinsing wafers in accordance with claim 8, wherein at least one other characteristic related to chemical phenomena of the deionized water in said tank, including the pH of the deionized water and the reduction-oxidation potential of the deionized water, is monitored, and chemicals are added to the deionized water in the tank in response to the monitoring of the other characteristic.

11. A method of cleaning and rinsing wafers in accordance with claim 10, wherein the monitoring of said other characteristic is done by withdrawing deionized water from the tank through said one or a second conduit into said or a second chamber external of the tank, with the monitoring being done in the deionized water in said chamber or said second chamber.

12. A method of cleaning and rinsing wafers in accordance with claim 11, wherein a second valve is provided in said second conduit and said second valve is opened only during steps (d) through (h).

13. A method of cleaning and rinsing wafers in accordance with claims 1 or 3, wherein fresh deionized water is sprayed on the surface of the deionized water in the tank during step (d) and each occurrence of step (g).

14. A method of cleaning and rinsing wafers in accordance with claim 1, wherein a blanket of nitrogen is provided over the top of the cleaning and rinsing tank.

15. A method of cleaning and rinsing wafers in accordance with claim 1, wherein nitrogen is injected into the water fed into the cleaning and rinsing tank.

* * * * *